(12) United States Patent
Allred et al.

(10) Patent No.: US 6,661,900 B1
(45) Date of Patent: Dec. 9, 2003

(54) DIGITAL GRAPHIC EQUALIZER CONTROL SYSTEM AND METHOD

(75) Inventors: Rustin W. Allred, Plano, TX (US); Hanna E. Witzgall, Arlington, VA (US); Stephen R. Handley, Houston, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/401,422

(22) Filed: Sep. 22, 1999

Related U.S. Application Data

(60) Provisional application No. 60/102,410, filed on Sep. 30, 1998.

(51) Int. Cl.[7] .............................. H03G 5/00; H03G 3/00
(52) U.S. Cl. ...................... 381/103; 381/98; 381/104; 381/107; 333/28 R
(58) Field of Search .................... 381/98, 103, 104, 381/107; 333/28 R

(56) References Cited

U.S. PATENT DOCUMENTS

| | | | | |
|---|---|---|---|---|
| 5,572,443 A | * | 11/1996 | Emoto et al. | 702/103 |
| 5,687,104 A | * | 11/1997 | Lane et al. | 708/300 |

* cited by examiner

*Primary Examiner*—Forester W. Isen
*Assistant Examiner*—Elizabeth McChesney
(74) *Attorney, Agent, or Firm*—W. Daniel Swayze, Jr.; W. James Brady; Frederick J. Telecky, Jr.

(57) ABSTRACT

A digital graphic equalizer uses a predetermined number of equalizing bands each having a different center frequency, and the center frequencies span a predetermined audio bandwidth. For each equalizing band a minimum set of filters is provided. The filters have a predetermined linear uniform spacing between the gain of successive filters.

23 Claims, 6 Drawing Sheets

DIGITAL GRAPHIC EQUALIZER CONTROL SYSTEM AND METHOD

RELATED PATENT APPLICATION

This application claims the benefit of U.S. Provisional Application Ser. No. 60/102,410 filed Sep. 30, 1998 entitled Digital Tone Control with Linear Step Coefficients.

TECHNICAL FIELD OF THE INVENTION

This invention is related in general to the field of digital audio signal processing. More particularly, the invention is related to a digital graphic equalizer control system and method.

BACKGROUND OF THE INVENTION

A graphic equalizer is a piece of audio equipment used to flatten the system spectral response in the audio signal band or produce other desirable effects. Current mid- to high performance audio systems typically include an analog graphic equalizer. Although analog systems produce excellent sound, there is a steady migration to digital systems. Digital systems are less costly to manufacture, are easy and flexible to modify, are programmable, and are portable. Further, the source of the audio signal is increasingly more likely to be digital than analog.

A graphic equalizer is made up of a set of equalizing filters with fixed center frequencies and bandwidths. Usually these filters are designed to span the entire audio band. The user is provided the capability to adjust the gain of these filters to change the equalization characteristics of the audio system and thus the output sound.

When a user alters the gain of the various equalizing filters in a digital graphic equalizer, undesirable artifacts discernible by the human ear are often generated because of the discrete, discontinuity nature of digital adjustment. These audible artifacts may sound like pops, clicks, zipper noises and swooshing noises. Typical techniques to minimize these artifacts are generally too costly, impracticable, and/or ineffective. For example, it was thought that by changing the equalizing filter coefficients in much smaller increments, such as 0.01 dB steps, the artifacts would be eliminated. However, 0.01 dB steps require an unacceptably large number of settings, such as 3,600 settings for a +/−18 dB audio control range. The large number of settings require additional implementation time, increase in programming complexity, and added costs of increased memory size.

SUMMARY OF THE INVENTION

Accordingly, there is a need for a digital graphic equalizer control system and method that substantially eliminates artifacts as equalizing filter coefficients are changed.

In one aspect of the invention, a digital graphic equalizer uses a predetermined number of equalizing bands each having a different center frequency, and the center frequencies span a predetermined audio bandwidth. For each equalizing band a minimum set of filters is provided. The filters have a predetermined linear uniform spacing between the gain of successive filters.

In another aspect of the invention, a method of digital graphic equalizer control includes the steps of receiving a user-selected gain setting for a equalizing filter, and gradually increasing or decreasing the filter gain in uniform steps on a linear scale, then a final step of less than the uniform step size is used to reach the user-selected again setting.

In yet another aspect of the invention, a digital audio system includes a digital graphic equalizer having a predetermined number of equalizing bands each having a different center frequency. The center frequencies of the bands span a predetermined audio bandwidth. Each equalizing band includes a minimum set of filters with a predetermined uniform linear spacing between the gain of successive filters.

Technical advantages of the present invention includes the provision of digital graphic equalizer control that yields an artifact-free sound when the gain of the graphic equalizer is being adjusted. The sound quality is therefore much improved and vastly more enjoyable. Further, the present invention achieves the elimination of audible artifacts in an efficient manner without requiring large memory capacity or resource-intensive computations. Therefore, cost savings and small physical size are additional benefits of graphic equalizers employing the teachings of the present invention.

BRIEF DESCRIPTION OF THE DRAWINGS

For a better understanding of the present invention, reference may be made to the accompanying drawings, in which.

DETAILED DESCRIPTION OF THE INVENTION

Figure 1:
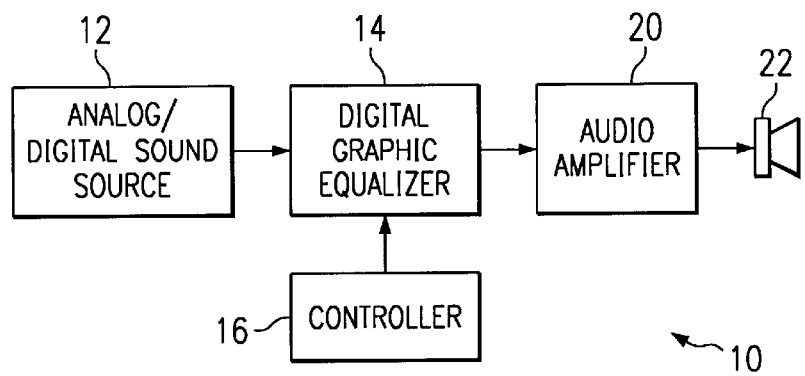
FIG. 1 is a block diagram of an audio system having a digital graphic equalizer and a digital graphic equalizer controller constructed according to an embodiment of the present invention.

FIG. 1 is a block diagram of an audio system 10 having a digital graphic equalizer and a digital graphic equalizer controller constructed according to an embodiment of the present invention. Audio system 10 includes a sound source 12, which may be digital or analog. An analog sound source would require the use of an analog-to-digital converter (not shown) to convert the analog audio signal into a digital audio signal. The digital audio signal is provided to a digital graphic equalizer 14 which would be used to flatten the system frequency spectral response or to provide other desirable effects under the control of a controller or control system 16. Controller 16 may compute equalizing filter equations and may include memory (not shown) for storing equalizing filter settings and coefficients. The output from digital graphic equalizer 14 is provided to an audio amplifier 20, which adjusts the overall signal strength. Although not shown, it is understood that a digital-to-analog converter is required to convert the digital signal from digital tone control system 18 to analog. A speaker 22 receives the resultant analog audio signal from audio amplifier 20.

Figure 2:
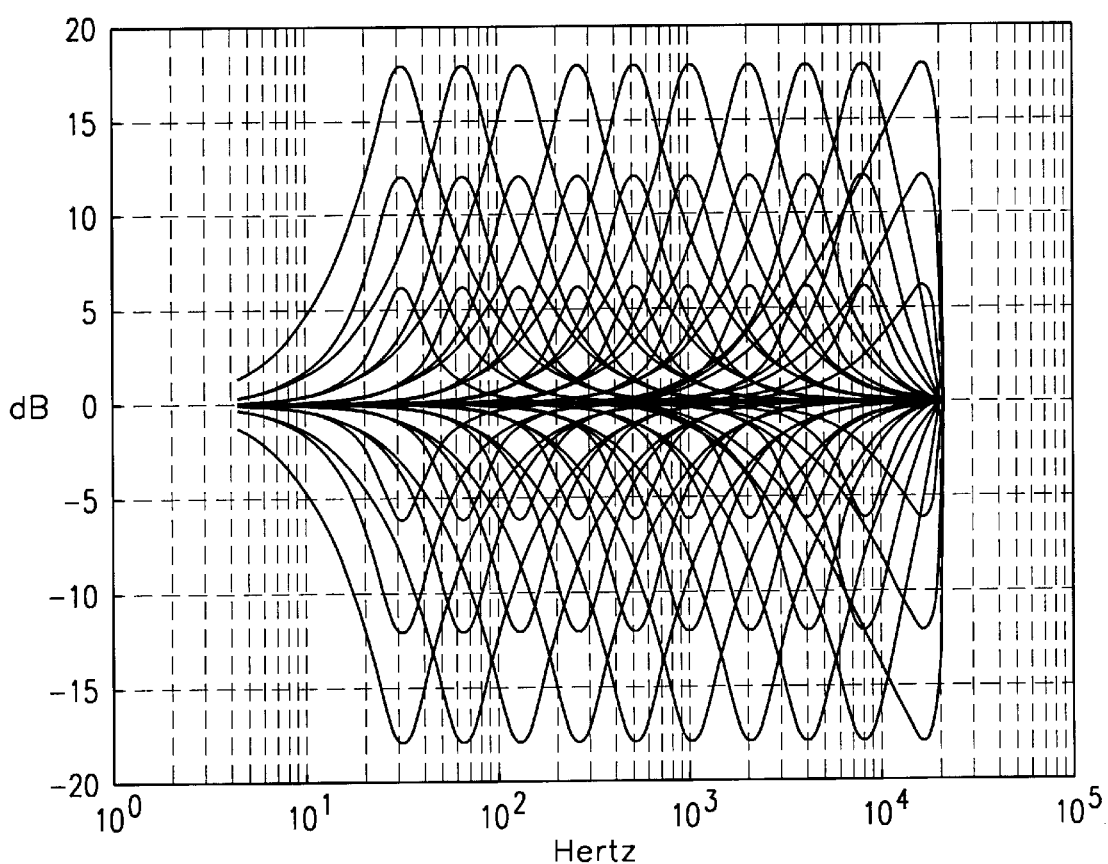
FIG. 2 is a graphic plot of an exemplary family of curves with representative dB increments for a 10-band graphic equalizer.

FIG. 2 is a graphic plot of an exemplary family of equalizing filters with representative gain increments for a 10-band graphic equalizer. The curves are plotted only in 6 dB gain increments for the sake of clarity. The typical increment is approximately 0.5 dB. The center frequencies of each band or channel are chosen, in this example, at the frequencies of the piano's C keys (32.7, 65.4, 130.8, 261.6, 523.3, 1046.5, 2093.0, and 4186.0 Hertz) with an additional 2 octaves above (8372.0, 16744.0 Hertz) to cover the entire audio band. The number of bands is chosen for suitability for a particular application. In an alternate embodiment, center frequencies may be 60, 250, 1,000, 4,000, 12,000 Hertz. In a digital graphic equalizer, the center frequencies may be easily modified. The center frequency/bandwidth value, or Q, may be set at 2, 1.5 or 1. The family of curves shown in FIG. 1 have a boost and cut range of +/−18 dB, but may be less or greater than this example. Again, the range is easily programmable in a digital graphic equalizer.

It is important to note that a digital graphic equalizer may have many different configurations. The number of bands or channels, the Qs, the sample rate, the adjustability range and granularity, the center frequencies, and other parameters may be chosen to suit the needs of a particular system design.

Figure 3A:
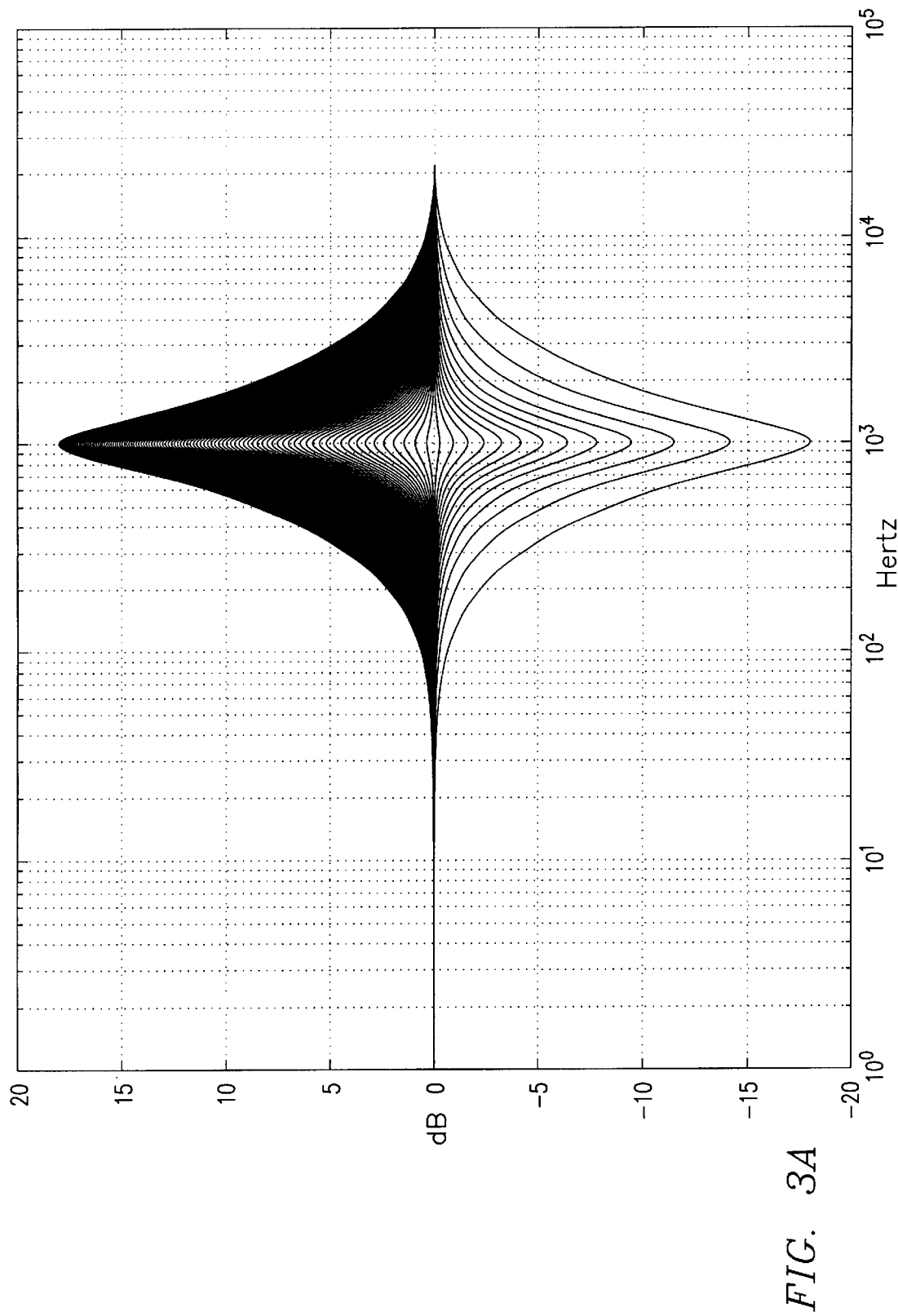
FIG. 3A is a graphic plot of an artifact-free family of equalizing filters for a single band constructed according to an embodiment of the present invention.
Figure 3B:
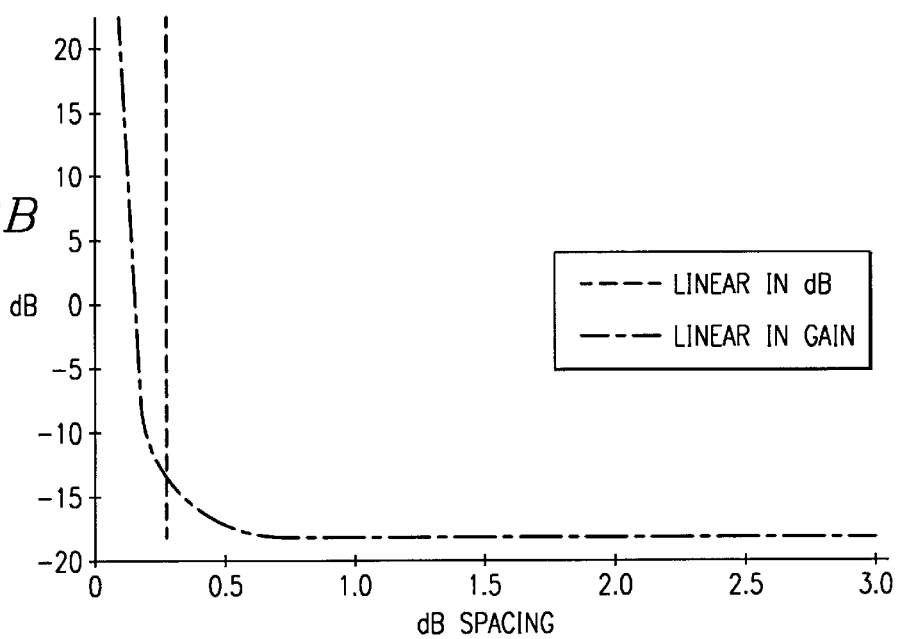
FIG. 3B is a graphic plot of filter gain in dB versus dB spacing contrasting linearity in dB space and linearity in gain space.

FIG. 3A is a graphic plot of an artifact-free family of equalizing filters for a single exemplary band constructed according to an embodiment of the present invention. Rather than changing the equalizing filter coefficients such that the filter gains change in uniform steps on a dB plot, the coefficients are changed such that the filter gains change in uniform steps on a linear plot according to the present invention. In this manner, when the equalizing filter is at a high gain setting, the gain is changed in very small and gradual increments to avoid generating audible artifacts. As the gain decreases, it becomes possible to change the gain in larger steps and yet still remain artifact free. In other words, by changing the coefficients such that the gain changes linearly, as opposed to logarithmically as in the traditional dB scale, artifacts would be eliminated. For example, 128 filters equally spaced in linear (gain) space between +/−18 dB may be used. In this example, the linear spacing between the filters is approximately 0.0611. FIG. 3A shows a logarithmic plot which illustrates the exponential spacing between the gain settings of the family of equalizing filters. FIG. 3B is a graphic plot of filter gain in dB versus dB spacing contrasting linearity in dB space and linearity in gain space.

In operation, graphic equalizer controller 16 initializes each family of filters to a set of coefficients corresponding to one of the filters in the family, typically the 0 dB coefficients or the previous setting for the filter prior to system power down. When the user changes the gain in the filters, graphic equalizer controller 16 automatically increment or decrement through all filters between the current setting and the final setting selected by the user. To truly make the coefficient changes gradual, a predetermined number of minimum samples are filtered with each set of coefficients. It has been shown that filtering approximately 64 samples for each set of coefficients with a sample rate of 44.1 KHz is satisfactory.

Figure 4:
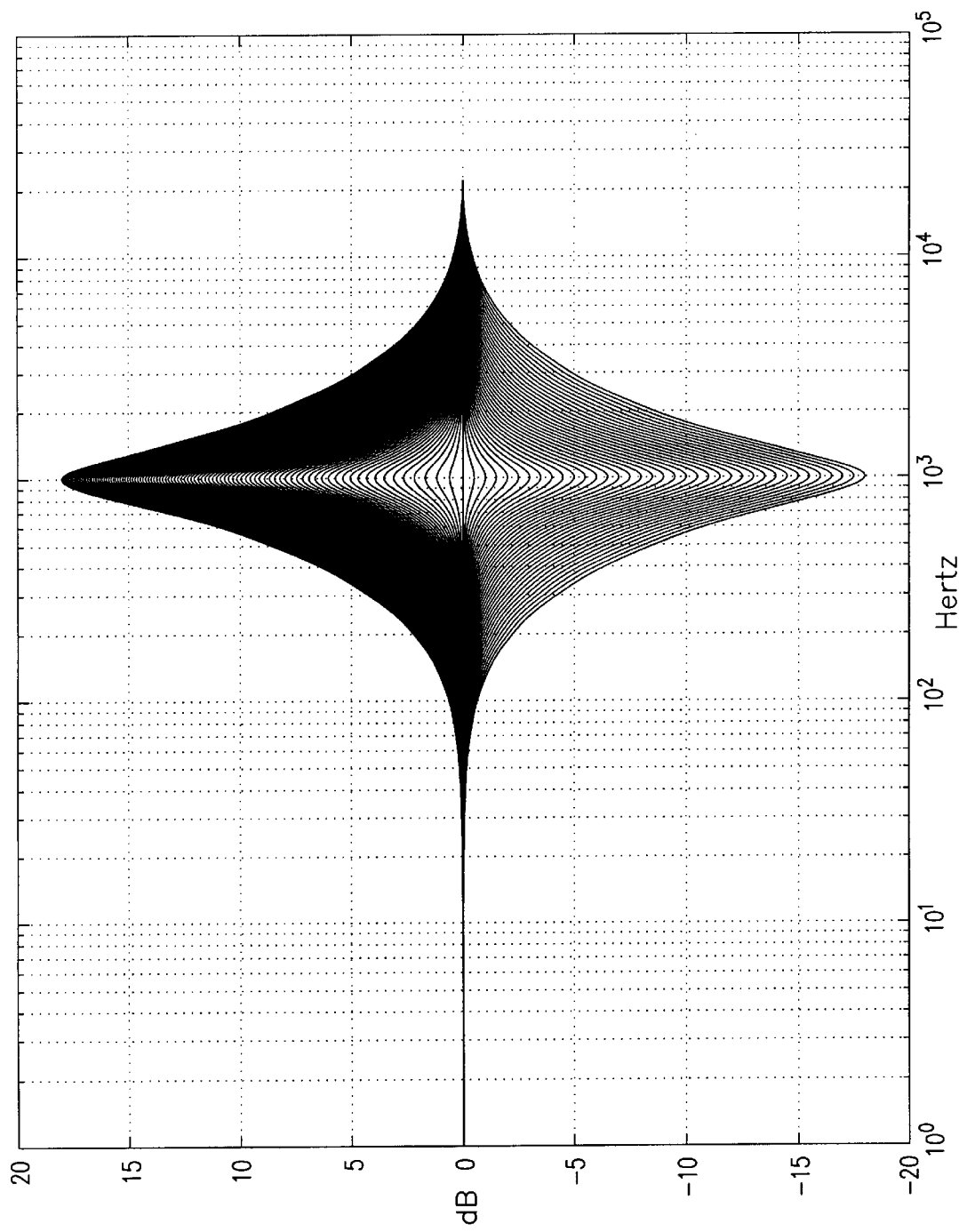
FIG. 4 is a graphic plot of an artifact-free full family of equalizing filters for a single band constructed according to an embodiment of the present invention.

FIG. 4 is a graphic plot of an artifact-free full family of equalizing filters for a single band constructed according to an embodiment of the present invention. It may be seen in FIG. 3A that the gain spacing for filters below 0 dB (the cut region) may be substantially greater than 0.5 dB and still remain artifact-free. However, this filter spacing is likely to provide an adjustable resolution that is too low for typical graphic equalizer applications. Most users desire an adjustable resolution less than 1 dB. Therefore, additional filters may be added to the cut region below 0 dB, as shown in FIG. 4. In effect, the spacing in the cut region shown in FIG. 4 is linear in dB space, with 0.5 dB increments. Accordingly, the family of filters shown in FIG. 3A is the minimum set of filters derived by changing the coefficients to achieve identical spacing in gain space, and additional filters are added to the cut region below 0 dB to increase the granularity of gain adjustment, as shown in FIG. 4. One way of adding the filters to the cut region is to provide filter gains that change in uniform 0.5 dB steps on a dB plot. Therefore, FIG. 4 provides a preferred gain schedule for the family of filters in graphic equalizer 14. Although not specifically shown, similar gain schedule is used for each band in the graphic equalizer.

Figure 5:
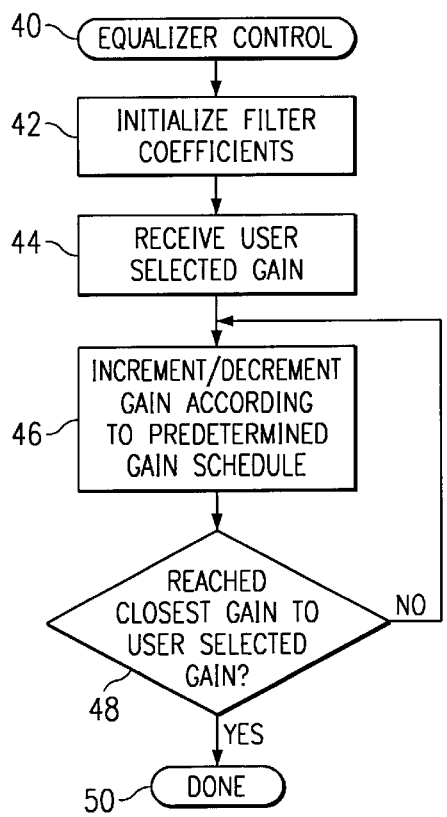
FIG. 5 is a flowchart of an embodiment of a graphic equalizer control method using a gain schedule according to the teachings of the present invention.

Referring to FIG. 5, a flowchart of an embodiment of graphic equalizer control method 40 according to the teachings of the present invention is shown. In block 42, the filter coefficients are initialized to a default setting or a setting previously set. In block 44, the user's gain selection or input is received by graphic equalizer controller 16. In block 46, graphic equalizer controller 14 then increments or decrements the filter gain by adjusting the filter coefficients according to the gain schedule such as the one shown in FIG. 4. The filter coefficients are changed until the gain setting in the gain schedule closest to the user-selected gain is reached, as determined in block 48. The process ends in block 50.

Figure 6:
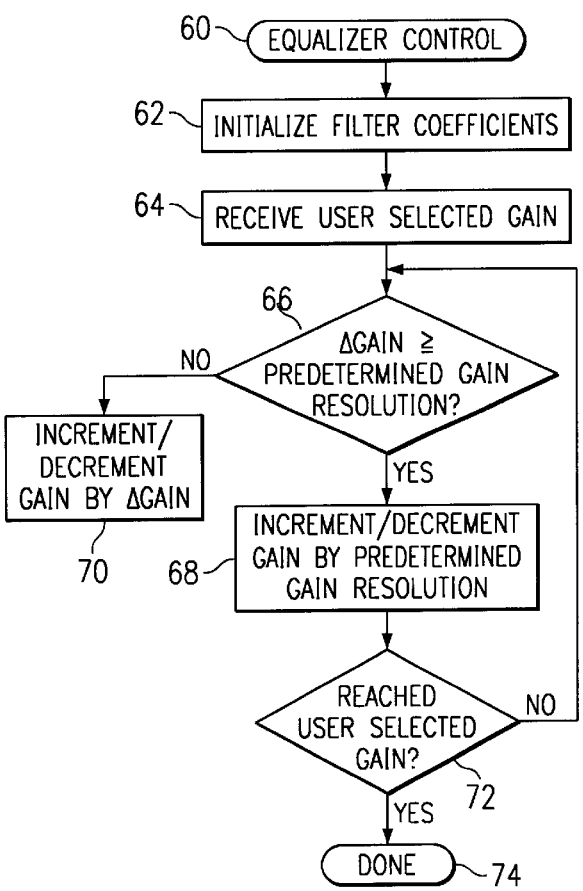
FIG. 6 is a flowchart of an embodiment of a graphic equalizer control method using relative linear steps according to the teachings of the present invention.

In an alternate embodiment, rather than use the fixed gain schedule such as shown in FIG. 4, a relative gain increment is used to attain the user-selected gain. Referring to FIG. 6, a graphic equalizer control method 60 using this technique is shown. In block 62, the filter coefficients are initialized to a default setting or a setting previously set. In block 64, the user's gain selection or input is received by graphic equalizer controller 16. A delta gain (again) is computed by determining a difference between the user-selected gain and the current gain. If the delta gain is greater than or equal to a predetermined gain resolution in gain (linear) space, such as 0.055, then the filter coefficients are adjusted so that the gain is incremented or decremented by the predetermined gain resolution value, as shown in blocks 66 and 68. This process is repeated until the user-selected gain is reached, as determined in block 72. Otherwise, the filter coefficients are adjusted so that the gain is incremented or decremented by delta gain to reach exactly the user-selected gain, as shown in block 70. The process ends in block 74. The advantage of this embodiment of the present invention is that the user-selected gain is always reachable even if it is not part of the predetermined gain schedule.

Figure 7:
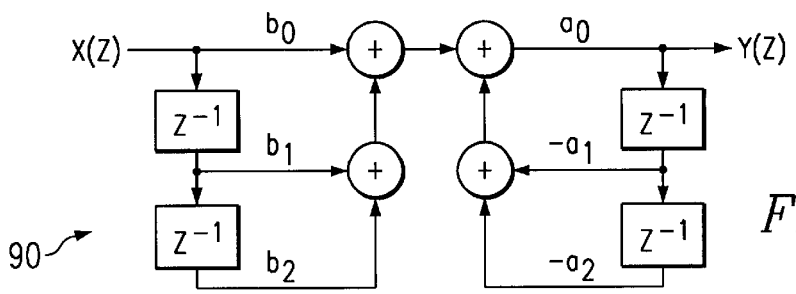
FIG. 7 is a block diagram of a digital filter which may be used to construct the equalizing filters of the present invention.
Figure 8A:
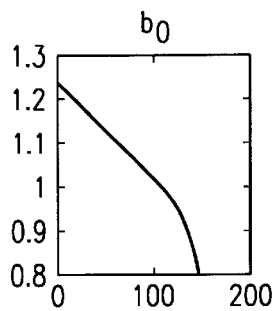
FIGS. 8A–8F are graphic plots of equalizing filter coefficients of the digital filter shown in FIG. 7 according an embodiment of the present invention.
Figure 8B:
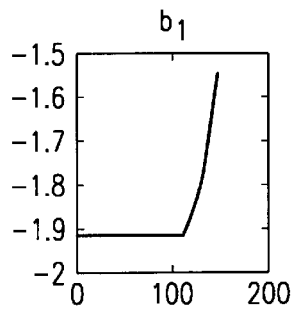
Figure 8C:
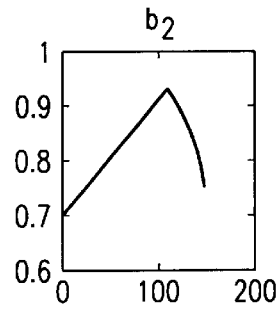
Figure 8D:
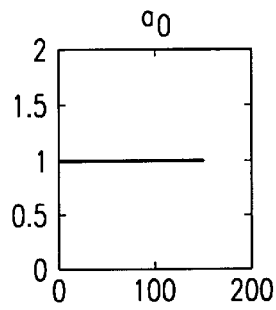
Figure 8E:
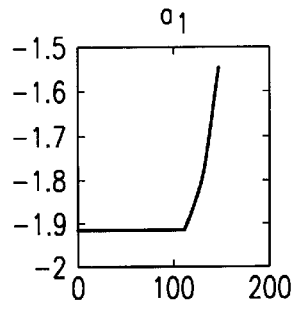
Figure 8F:
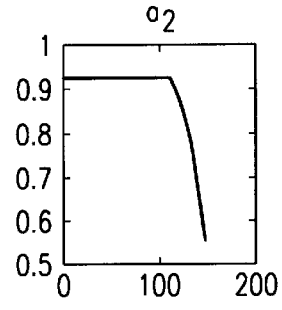

FIG. 7 is a block diagram of a typical second order IIR filter which may be used to construct the equalizing filters of the present invention. The filter coefficients are $a_0$, $a_1$, $a_2$, $b_0$, $b_1$ and $b_2$ and $z^{-n}$ is a delay of n samples. The transfer function of the filter is:

$$Hz = \frac{Y(z)}{X(z)} = \frac{b_0 + b_1 \cdot z^{-1} + b_2 \cdot z^{-2}}{a_0 + a_1 \cdot z^{-1} + a_2 \cdot z^{-2}}$$

wherein Y(z) is the audio output signal in the frequency domain and X(z) is the audio input signal in the frequency domain.

In implementations, the coefficients for the entire family of filters and for all the bands are stored so that as the user changes the gain for a given filter, the coefficients can be quickly recalled and used to update the filters. However, storing all these coefficients is costly and memory intensive for many applications.

Referring to FIGS. 8A–8F, which are graphic plots of the equalizing filter coefficients of the digital filter shown in FIG. 7 according an embodiment of the present invention. The coefficients are plotted against the filter index, where filter 1 is at 18 dB and filter 147 is at –18 dB. It may be seen that coefficient $a_0$ is always 1, coefficients $b_1$ and $a_1$ are identical, and the other coefficients appear to be readily obtainable by simple two-segment linearization approximation. Alternatively, piecewise linearization may be used.

Figure 9:
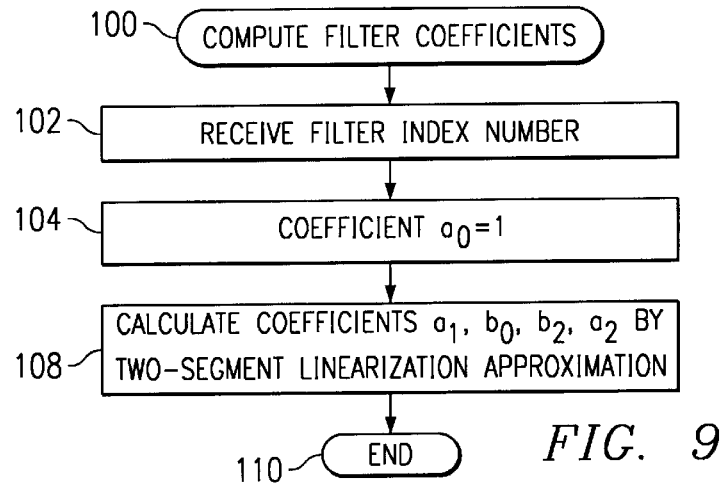
FIG. 9 is a flowchart of an exemplary process for obtaining the filter coefficients according to the teachings of the present invention.

FIG. 9 is a flowchart of an exemplary process 100 for obtaining the filter coefficients according to the teachings of the present invention. The process receives the index number of the filter for which the coefficients are required, as shown in block 102. Coefficient $a_0$ is set to a constant 1, as shown in block 104. The identical $b_1$ and $a_1$ coefficients may be calculated in block 108 along with coefficients $b_0$, $b_2$, and $a_2$ by two-segment linearization approximation. Because $a_1=b_1$, only one computation is needed. The linearization approximation may be done by reading a stored set of coefficients, for example the coefficients for 0 dB, and the equations that approximate the coefficient plots. The process ends in block 110.

When the filter coefficients are obtained in this manner, the computational burden is very low and little memory usage is required. Therefore, the filter coefficients are readily available when they are needed.

Figure 10A:
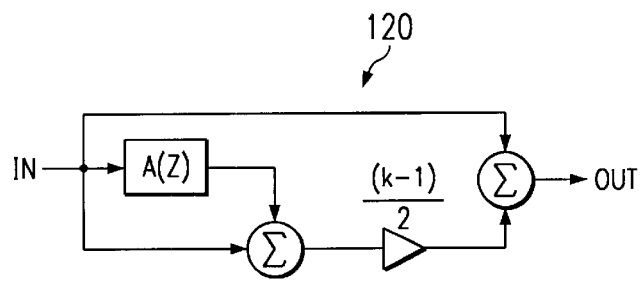
FIG. 10A is a block diagram of a filter which may be used to construct the equalizing filters of the present invention.
Figure 10B:
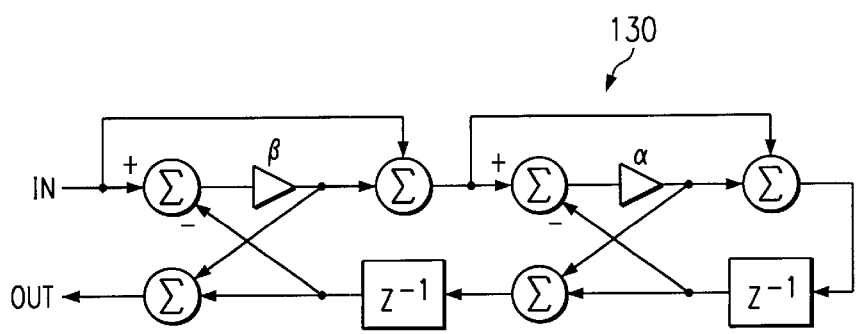
FIG. 10B is a block diagram of a second order allpass filter which may be used to construct the filter of FIG. 10A.
Figure 11A:
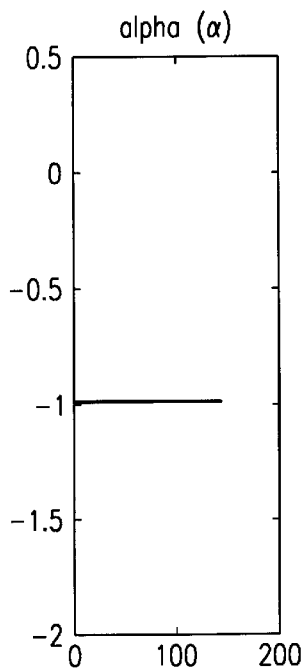
FIGS. 11A–11C are graphic plots of equalizing filter coefficients of the allpass filter shown in FIG. 10B according an embodiment of the present invention.
Figure 11B:
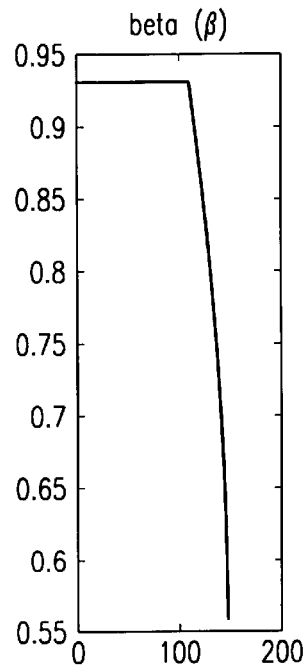
Figure 11C:
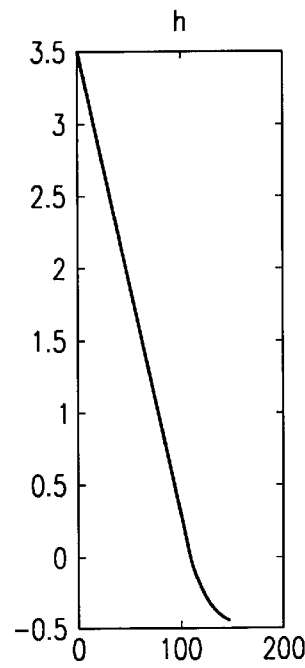

FIG. 10A is a block diagram of a filter 120 based on a second order allpass filter which may be used to construct the equalizing filters of the present invention. The transfer function of this filter may be written as:

$$H(z) = 1 + \frac{k-1}{2}[1 \pm A(z)],$$

where A(z) is the transfer function of a second order allpass filter 130 shown in FIG. 10B. Filter 120 only has three coefficients, $\alpha$, $\beta$, and h, where h=(k–1)/2. FIGS. 11A–11C are graphic plots of the filter coefficients of the allpass filter shown in FIG. 10B according an embodiment of the present invention. Note that $\alpha$ is fixed for each center frequency, and that $\beta$ and h may both be easily computed by piecewise linearization, approximated by two-segment linearization, or other means. Therefore, the process for obtaining the filter coefficients is similar to that shown in FIG. 9.

The present invention teaches a new digital graphic equalizer that provides artifact-free sound as the gain settings are changed by the user. Furthermore, the invention provides for an efficient method for obtaining the filter coefficients best suited for those applications with limitations on memory storage, processor computational resources, physical size of the component, and other cost considerations.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. A digital graphic equalizer system, comprising:
   a predetermined number of equalizing bands each having a different center frequency, the center frequencies spanning a predetermined audio bandwidth, each equalizing band comprises:
      a minimum set of filters with a predetermined linear uniform spacing between the gain of successive filters.

2. The digital graphic equalizer system, as set forth in claim 1, wherein each equalizing band spans a boost region above 0 dB and a cut region below 0 dB, each equalizing band further comprises an additional set of filters with a predetermined uniform dB spacing in the cut region.

3. The digital graphic equalizer system, as set forth in claim 2, wherein the additional set of filters have a gain spacing of 0.5 dB in the cut region.

4. The digital graphic equalizer system, as set forth in claim 1, wherein each equalizing band spans a boost region above 0 dB and a cut region below 0 dB, each equalizing band comprises:
   the minimum set of filters with predetermined linear uniform gain spacing in the boost region; and
   an additional set of filters with a predetermined uniform dB spacing in the cut region.

5. The digital graphic equalizer system, as set forth in claim 1, wherein each band comprises at least 128 filters with gains equally spaced at most 0.0611 apart and spanning between +/–18 dB.

6. The digital graphic equalizer system, as set forth in claim 1, wherein each band comprises at least 100 filters with gains equally spaced at most 0.055 apart and spanning between +/–15 dB.

7. A method of digital graphic equalizer control, comprising:
   receiving a user-selected gain setting for a equalizing filter;
   gradually increasing or decreasing the filter gain in uniform steps on a linear scale to be as close as possible to the user-selected gain setting.

8. The method, as set forth in claim 7, further comprising changing filter coefficients of the filter to change the gain of the filter in uniform steps on a linear scale toward the user-selected gain setting.

9. The method, as set forth in claim 7, further comprising:
   changing filter coefficients of the filter to change the gain of the filter in uniform steps on a linear scale for gain above 0 dB; and
   changing filter coefficients of the filter to change the gain of the filter in uniform steps on a logarithmic dB scale for gain below 0 dB.

10. The method, as set forth in claim 7, further comprising computing filter coefficients of the filter to change the gain of the filter in uniform steps on a linear scale toward the user-selected gain setting.

11. The method, as set forth in claim 10, wherein computing the filter coefficients comprises using piecewise linearization approximation to compute the filter coefficients.

12. The method, as set forth in claim 10, wherein computing the filter coefficients comprises using two-segment linearization approximation to compute the filter coefficients.

13. The method, as set forth in claim 7, further comprising:
    storing a set of filter coefficient values for the determining a filter index of a filter to be computed; anf
    computing a second set of filter coefficients from the stored set of filter coefficient values and the filter index by using two-segment linearization approximation.

14. The method, as set forth in claim 7, further comprising:
    obtaining a set of filter coefficient values for the filter;
    obtaining equations for the set of filter coefficients;
    determining a filter index of a filter to be computed; and
    computing a second set of filter coefficients from the stored set of filter coefficient values, filter coefficient equations, and the filter index by using piecewise linearization approximation.

15. The method, as set forth in claim 7, wherein gradually increasing or decreasing the filter gain comprises:
    determining a difference between the user-selected gain setting and a current gain setting of the filter;
    incrementing or decrementing the filter gain by the uniform step in response to the difference being greater than or equal to the uniform step size;
    otherwise incrementing or decrementing the filter gain by the difference in response to the difference being less than the uniform step size; and
    repeating the above steps until the user-selected gain setting is reached.

16. The method, as set forth in claim 7, wherein gradually increasing or decreasing the filter gain comprises:
    determining a difference between the user-selected gain setting and a current gain setting of the filter;
    incrementing or decrementing the filter gain by the uniform step in response to the difference being greater than or equal to the uniform step size;
    otherwise incrementing or decrementing the filter gain by the difference in response to the difference being less than the uniform step size;
    computing a set of filter coefficients for the new filter gain setting by piecewise linearization; and
    repeating the above steps until the user-selected gain setting is reached.

17. The method, as set forth in claim 7, comprising repeating both steps for the filter in each band of the digital graphic equalizer.

18. A digital audio system, comprising:
    a digital graphic equalizer having a predetermined number of equalizing bands each having a different center frequency, the center frequencies spanning a predetermined audio bandwidth, each equalizing band includes a minimum set of filters with a predetermined uniform linear spacing between the gain of successive filters.

19. The digital audio system, as set forth in claim 18, wherein each equalizing band spans a boost region above 0 dB and a cut region below 0 dB, each equalizing band further comprises an additional set of filters with a predetermined uniform dB spacing between the gain of successive filters in the cut region.

20. The digital audio system, as set forth in claim 19, wherein the additional set of filters have a gain spacing of approximately 0.55 dB in the cut region.

21. The digital audio system, as set forth in claim 18, wherein each equalizing band spans a boost region above 0 dB and a cut region below 0 dB, each equalizing band comprises:
    the minimum set of filters with predetermined uniform linear gain spacing in the boost region; and
    an additional set of filters with a predetermined uniform dB spacing in the cut region.

22. The digital audio system, as set forth in claim 18, wherein the digital graphic equalizer computes the filter coefficients using piecewise linearization approximation.

23. The digital audio system, as set forth in claim 18, wherein the digital graphic equalizer computes the filter coefficients using two-segment linearization approximation.

* * * * *